(12) United States Patent  (10) Patent No.: US 6,977,408 B1
Lin et al.  (45) Date of Patent: Dec. 20, 2005

(54) HIGH-PERFORMANCE NON-VOLATILE MEMORY DEVICE AND FABRICATION PROCESS

(75) Inventors: Chih-Chuan Lin, San Jose, CA (US); Sunil D. Mehta, San Jose, CA (US)

(73) Assignee: Lattice Semiconductor Corp., Hillsboro, OR (US)

( * ) Notice: Subject to any disclaimer, the term of this patent is extended or adjusted under 35 U.S.C. 154(b) by 54 days.

(21) Appl. No.: 10/610,253

(22) Filed: Jun. 30, 2003

(51) Int. Cl.[7] ............................................. H01L 29/72
(52) U.S. Cl. ...................... 257/315; 257/314; 257/316; 257/321; 257/403; 438/152; 438/176; 438/267; 438/522; 438/694
(58) Field of Search ........................ 257/310, 311, 312, 257/513, 314, 315, 316, 317, 321, 403; 438/264, 438/265, 266, 257, 126, 267, 523, 694

(56) References Cited

U.S. PATENT DOCUMENTS

| 5,714,412 A | * | 2/1998 | Liang et al. | ................ | 438/266 |
| 6,051,467 A | * | 4/2000 | Chan et al. | ................ | 438/264 |
| 6,281,545 B1 | * | 8/2001 | Liang et al. | ................ | 257/315 |
| 2002/0160595 A1 | * | 10/2002 | Hineman | ................ | 438/592 |
| 2003/0170954 A1 | * | 9/2003 | Rudeck | ................ | 438/266 |

OTHER PUBLICATIONS

Ota, et al., "Novel Locally Strained Channel Technique for High Performance 55nm CMOS", pp. 14-17, IEDM Dec. 2002.

* cited by examiner

Primary Examiner—Nathan J. Flynn
Assistant Examiner—Fazli Erdem

(57) ABSTRACT

An EEPROM device exhibiting high saturation current and low signal propagation delay and a process for fabricating the device that includes the formation of refractory metal silicide regions in the source and the drain regions and the gate electrode of an MOS transistor within an EEPROM memory cell. A floating-gate protect layer is formed over the floating-gate electrode and a relatively thick cap oxide layer is formed to overlie the floating-gate protect layer and the source and drain regions and gate electrode of the MOS transistor. A doped oxide layer is formed to overlie the cap oxide layer. The cap oxide layer is formed to a thickness sufficient to create strain in the channel region of the MOS transistor, while not having a thickness that could cause poor data retention in the EEPROM memory cell.

20 Claims, 5 Drawing Sheets

HIGH-PERFORMANCE NON-VOLATILE MEMORY DEVICE AND FABRICATION PROCESS

TECHNICAL FIELD

The present invention relates, generally, to non-volatile memory devices and fabrication processes and, more particularly, to EEPROM memory devices and methods for their fabrication.

BACKGROUND

In order to build faster and more complex memory devices, device manufacturers have increased the memory capacity of the devices, while reducing the overall size of memory circuits. The desire to increase the operating speed of memory circuits has led to the fabrication of transistors having exceedingly small gate lengths. For example, transistors in non-volatile memory devices are typically fabricated having gate lengths on the order of 0.2 microns and smaller. In addition to fabricating transistors having very small gate, various materials, such as refractory metal silicides, are employed to reduce the electrical resistance within the transistors.

While the use of various refractory metals and refractory metal silicides has led to transistors showing improved performance, further performance increases are possible through the creation of localized strain in the transistor channel region. Strain in the channel region improves the electron mobility and increases the operating speed of N-channel metal-oxide-semiconductor (MOS) transistors. Various techniques are known for creating localized strain in the channel region. For example, providing material interfaces having a lattice mismatch creates biaxial strain that improves both electron and whole mobility. Additionally, strain can be created by forming silicon nitrite layers over the channel region. Further, strain in the channel region can be created by implanting arsenic into a polycrystalline silicon gate electrode, followed by an annealing process to expand the implanted polycrystalline silicon. The annealing process is carried out after forming a thick silicon dioxide layer over the implanted gate electrode. By covering the gate electrode with silicon dioxide, the strain caused by expansion of the polycrystalline silicon is directed to the channel region underlying the gate electrode.

While several techniques exist for creating localized strain in transistor channel regions, the implementation of these techniques in an EEPROM device is problematic. To effectively store data in an EEPROM device, electrical charge must remain on a floating-gate electrode after a programming operation. Programming and erasing operations are carried out at relatively high voltage levels. During high voltage operation, there is a tendency for the charge on the floating-gate electrode to bleed off, or leak, as a result of exposure to high electric fields. When charge leaks from the floating-gate electrode, the memory cell will lose its stored data. Good data retention is a key reliability characteristic of a non-volatile memory device. Although it is desirable to increase the operating speed of EEPROM devices, the techniques for creating localized strain in a transistor channel region described above are largely incompatible with the need for good data retention in the memory device. For example, it is known that poor data retention can occur if the doped passivation layers overlying the floating-gate electrode are separated from the floating-gate electrode by thick intervening dielectric layers. Accordingly, the creation of a strained channel region through the placement of compressive stress on a transistor gate electrode must be undertaken with great care.

Typical EEPROM memory cells include MOS transistors that enable charge to be placed on the floating-gate electrode. Enhanced overall memory device performance can be obtained by increasing the performance of the MOS transistors. Since further scaling of device dimensions to smaller and smaller feature sizes can only be obtained at great expense, creating localized strain in the channel regions of the MOS transistors offers a useful method to increase device performance at minimal expense. The creation of compressive stress in the MOS transistor gate electrodes must, however, be implemented in such a way as to avoid a loss of data retention in an EEPROM device.

SUMMARY

In accordance with one aspect of the invention, there is provided a process for fabricating an EEPROM device that includes providing a substrate and forming an MOS transistor. The MOS transistor includes a gate electrode overlying the substrate and source and drain regions in the substrate. The MOS gate electrode and the source and drain regions each have a silicide region therein. A cap insulating layer is formed that contacts the silicide region in the MOS gate electrode and the source and drain regions. The cap insulating layer has a thickness of about 800 angstroms to about 1200 angstroms. A doped oxide layer is formed to overlie the cap insulating layer.

In another aspect, the present invention includes a process for forming a high-speed EEPROM device. A substrate is provided having a floating-gate electrode encapsulated by a first insulating layer and an MOS transistor. The MOS transistor includes a transistor gate electrode overlying a channel region and having a silicide region therein. A permanent capping layer is formed overlying the first insulating layer and contacting the silicide region in the transistor gate electrode. The permanent capping layer is formed to a thickness sufficient to create strain in the channel region of the MOS transistor.

In yet another aspect, the invention includes an EEPROM device. The device includes a substrate having a floating-gate electrode overlying the substrate and an MOS transistor. The MOS transistor includes a gate electrode with a silicide region therein. A first insulation layer at least partially encapsulates the floating-gate electrode. A second insulation layer overlies the first insulation layer and the gate electrode of the MOS transistor. The thickness of the second insulation layer is about 800 angstroms to about 1200 angstroms. A doped oxide layer overlies the second insulation layer.

Figure 1:
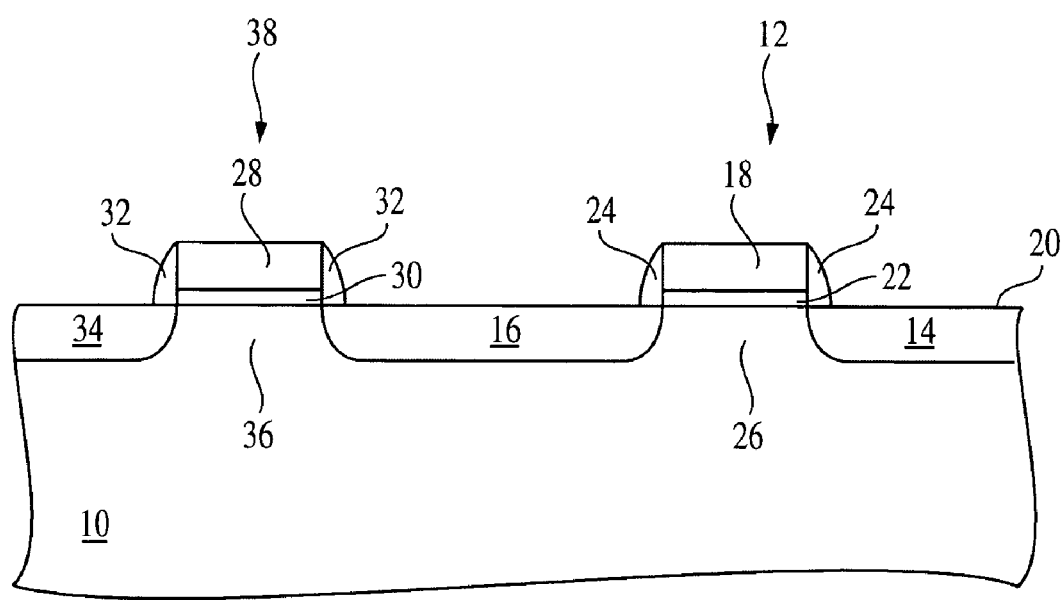
FIGS. 1–4 illustrate, in cross-section, processing steps in accordance with the invention.
Figure 2:
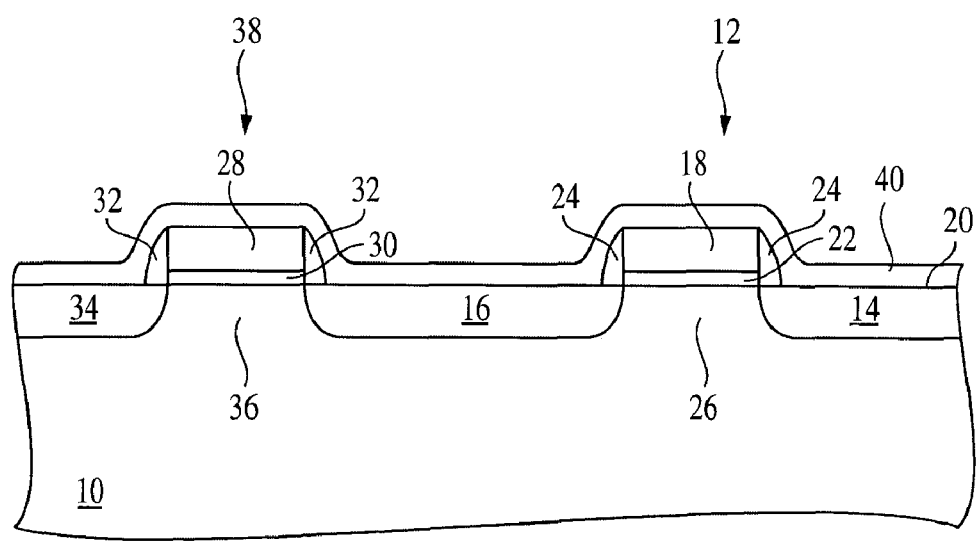

It will be appreciated that for simplicity and clarity of illustration, elements shown in the Figures have not necessarily been drawn to scale. For example, dimensions of the some of the elements are exaggerated relative to each other for clarity. Further, where considered appropriate, reference numerals have been repeated among the Figures to indicate corresponding elements.

DETAILED DESCRIPTION

The present invention is for an EEPROM device having improved transistor performance and for a process of fabricating the device. In particular, the device and process provide improved transistor performance, while maintaining the necessary data retention characteristics of an EEPROM memory cell. The improved transistor performance is provided, in part, by forming a cap oxide layer having a thickness sufficient to create strain in the channel regions of MOS transistors in the memory cell. The strain created in the channel regions of the MOS transistors increases the saturation current and reduces signal propagation delay through the transistors.

Those skilled in the art will appreciate that numerous device architectures exist for EEPROM memory cells. Further, those skilled in the art will recognize that within a given type of EEPROM cell, the arrangement of memory cell components can vary. To illustrate the invention, a fabrication sequence will be described for the fabrication of an MOS transistor and a floating-gate transistor in a two-transistor EEPROM memory cell. Those skilled in the art will, however, appreciate that the invention elements of the present invention can be applied to other memory devices, such as three-transistor EEPROM memory devices. Further, although for the purpose of illustrating the invention, an MOS transistor will be illustrated adjacent to a floating-gate electrode. Those skilled in the art will appreciate that MOS transistors of the invention can be positioned differently relative to a floating-gate electrode within an EEPROM memory cell.

As illustrated in FIG. 1, an MOS transistor 12 includes a drain region 14 and a source region 16 in semiconductor substrate 10. A gate electrode 18 overlies a principal surface 20 of semiconductor substrate 10 and is separate therefrom by gate dielectric layer 22. Sidewall spacers 24 reside adjacent to the edges of gate electrode 18 and overlie a portion of principal surface 20. A channel region 26 resides in semiconductor substrate 10 below gate electrode 18 and between drain region 14 and source region 16.

A floating-gate electrode 28 overlies principal surface 20 and is separated therefrom by a tunnel dielectric layer 30. Sidewall spacers 32 reside adjacent to the edges of floating-gate electrode 28 and overlie a portion of principal surface 20. A source region 34 resides in semiconductor substrate 10 and is spaced apart from source region 16 by a charge transfer region 36. Source region 16 acts as a drain region with respect to floating-gate electrode 28. Collectively, floating-gate electrode 28, source region 16, source region 34, and charge transfer region 36 comprise functional components of a sense transistor 38.

Those skilled in the art will recognize the particular structure illustrated in FIG. 1 as showing a portion of two-transistor EEPROM memory cell. The structure illustrated in FIG. 1 is simplified in order to better illustrate operative components of the invention. Those skilled in the art will appreciate that a fully functional EEPROM memory cell includes additional components, and can also include well regions and other doped regions in the substrate.

In operation, electrical potentials applied to drain region 14 and source region 34 cause electrical charge to be transferred to and from floating-gate electrode 28. MOS transistor 12 provides a means of applying voltage potential to source region 16 and, in that capacity, serves as a write transistor in the illustrated EEPROM memory cell.

Those skilled in the art will appreciate that the performance of the EEPROM memory cell can be enhanced by increasing the operating speed of MOS transistor 12. Accordingly, one embodiment of the inventive process will now be described for increasing the saturation current within MOS transistor 12 and reducing the overall signal propagation delay through MOS transistor 12.

In accordance with the invention, a first insulating layer 40 is deposited to overlie MOS gate electrode 18, floating-gate electrode 28, and the source and drain regions formed at principal surface 20. First insulating layer 40 can be one of a number of different electrically insulating materials used in semiconductor device fabrication. For example, first insulating layer 40 can be a silicon oxide material, silicon nitride, a composite material that includes both silicon oxide and silicon nitride, a glass silicate layer, and the like. As used herein, the term "silicon oxide," is intended to apply to all stociometric forms of silicon and oxygen, for example, SiO, $SiO_2$, and the like. Further, first insulating layer 40 can be formed by a variety of processes, including chemical-vapor-deposition (CVD), spin-on-glass (SOG), and the like. Additionally, first insulating layer 40 can be formed to a range of thicknesses, and in particular, to a thickness of about 400 angstroms to about 600 angstroms, and more particularly, to a thickness of about 500 angstroms. The deposition process forms a layer of insulating material having substantially a uniform thickness on semiconductor substrate 10.

Figure 3:
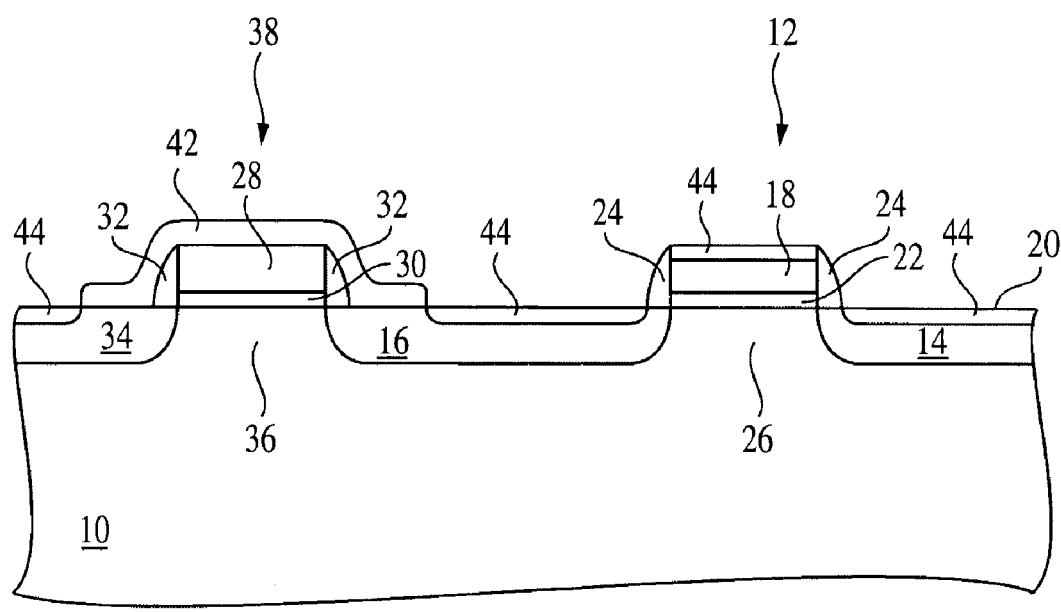

After performing first insulating layer 40, conventional lithographic and etching processes are carried out to form a floating-gate protect layer 42, as illustrated in FIG. 3. Floating-gate protect layer 42 overlies floating-gate electrode 28, side wall spacers 32 and portions of source region 34. Once the etching process is complete, the lithographic mask is removed leaving floating-gate protect layer 42, which at least partially encapsulates floating-gate electrode 28.

Next, silicide regions are formed at principal surface 20 in source regions 16 and 34 and drain region 14, and at the upper surface of MOS gate electrode 18. The silicide regions are formed by reacting a refractory metal with silicon in substrate 10 and MOS gate electrode 18. Those skilled in the art will recognize that a refractory metal silicide can be formed by a variety of processes, including various refractory metal deposition processes, implantation processes, and the like. In accordance with one embodiment of the invention, a salicide process is carried out form refractory metal silicide regions 44 and semiconductor substrate 10 and MOS gate electrode 18.

To carry out the salicide process, a thin layer of refractory metal, such as titanium, cobalt, nickel, and the like, is deposited to overly principal surface 20 and MOS gate electrode 18. In one particular embodiment of the invention, a cobalt layer is deposited. Then, a thermal process is carried out to react the refractory metal with any silicon in direct contact with the refractory metal layer. The thermally-induced reaction forms a refractory metal salicide in all locations where the refractory metal comes into direct contact with a silicon surface. The thermal process can be one of a number of different thermal processes, such as conventional conductive heating, or rapid thermal annealing, and the like. Additionally, thermal processing can be carried out in stages in which a first thermal annealing process is performed, followed by a second thermal annealing step to complete the reaction that forms a low-resistance refractory metal salicide. Those skilled in the art will appreciate that numerous variations for the formation of a refractory metal salicide are possible. For example, various surface treatment processes can be carried out prior to depositing the refractory metal layer. Once the silicide forming reaction is complete, remaining unreacted portions of the refractory metal layer are removed by an etching process.

In accordance with the invention, floating-gate protect layer 42 prevents the silicide reaction from taking place with the silicon in floating-gate electrode 28 and portions of source regions 16 and 34 immediately adjacent to side wall spacers 32. Accordingly, the salicide reaction forms refractory metal silicide regions in and around MOS transistor 12, but does not form silicide regions in close proximity to sense transistor 38.

In accordance with the invention, a second insulating layer 46 is formed to overlie first insulating layer 42, MOS gate electrode 18, and remaining portions of principal surface 20. Second insulating layer 46 functions as a cap insulation layer that directly contacts refractory metal silicide regions 44. In one embodiment of the invention, cap insulation layer 46 is formed by the deposition of an electrically insulating material. Preferably, second insulating layer 46 is formed by deposition of a silicon oxide layer to a thickness of about 800 angstroms to about 12 angstroms. In a preferred embodiment of the invention, second insulating layer 46 is deposited by CVD to a thickness of about 1,000 angstroms. The deposition process is carried out to form a uniformly thick layer of silicon oxide overlying MOS gate electrode 18 and floating-gate electrode 28 and first insulating layer 42. As will be subsequently described, the particular thickness of second insulating layer 46 impacts the data retention of an EEPROM memory cell. By depositing second insulating layer 46 to a relatively large thickness, compressive stress is applied to channel region 26 in MOS transistor 12. The strain created in channel region 26 increases electron mobility within the channel region, which increases the saturation current of the MOS transistor and reduces signal propagation delay.

After depositing second insulating layer 46, a doped insulating layer 48 is deposited to overlie second insulating layer 46. Those skilled in the art will appreciate that a variety of deposition processes can be carried out to form a doped insulating layer. Typically, doped insulating layers used in EEPROM memory devices include boron-doped silicon glass (BSG), phosphorous-doped silicate glass (PSG), and boron-phosphorous-doped silicate glass (BPSG). In addition to various dopants, doped insulating layers can be formed by processes, such as CVD, plasma-enhanced CVD (PECVD), and the like. In one embodiment of the invention, doped insulating layer 48 is a silicon oxide layer formed by a CVD deposition process using an alkyl silicon source gas. One suitable alkyl source gas is tetraethylorthosilane (TEOS). In one particular embodiment of the invention, second insulating layer 46 is doped with both boron and phosphorous.

The doping of the silicate glass layer improves the flow characteristics of the layer when the layer is exposed to thermal processing. The particular relative concentration of boron and phosphorous in doped insulating layer 48 can vary depending upon the particular flow characteristics needed to create a uniformly smooth layer over the underlying device structure. In many applications, a boron concentration of about 3 wt. % to about 5 wt. % and a phosphorous concentration of about 4 wt. % to about 7 wt. % are sufficient to impart desirable flow characteristics. In one embodiment of the invention, the CVD deposition and thermal flow process are carried out to form a doped insulating layer having a thickness of about 5,000 angstroms to about 10,000 angstroms.

In accordance with the invention, the particular thickness of second insulating layer 46 creates sufficient stress within channel region 26 to improve electron mobilities within MOS transistor 12. In addition to having a thickness sufficient to create compressive stress in channel region 26, second insulating region layer 46 is not formed to a thickness that compromises data retention in an EEPROM memory cell. Those skilled in the art will understand that data, in the form of electrical charge retained on floating-gate electrode 28, can be compromised if doped oxide layer 48 is not sufficiently proximate to floating-gate electrode 28.

Figure 4:
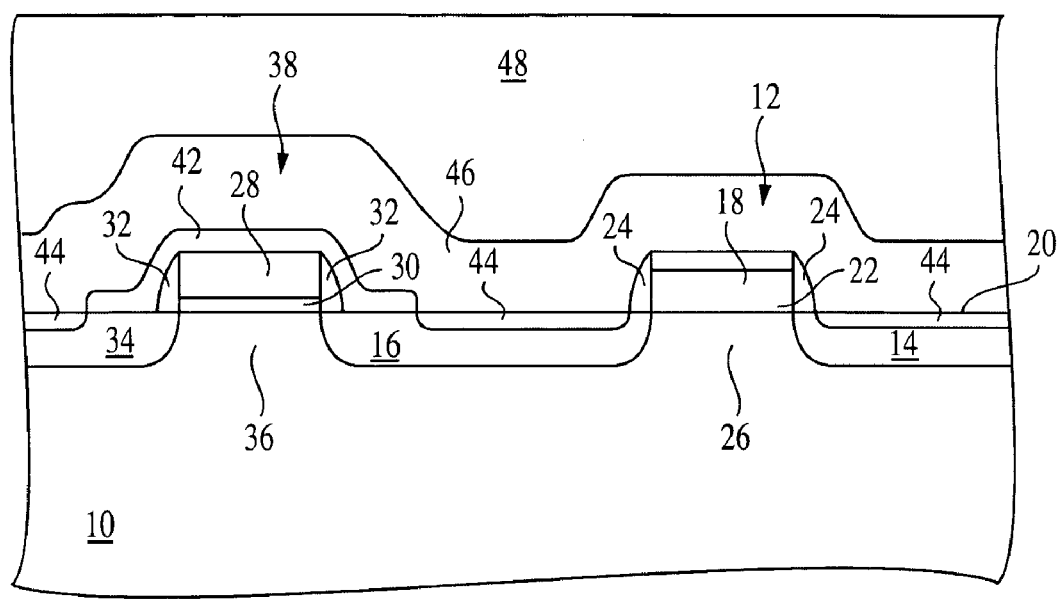

In the EEPROM device structure illustrated in FIG. 4, both floating-gate protect layer 42 and second insulating layer 46 separate floating-gate electrode 28 from doped insulating layer 48. Accordingly, the separation distance between floating-gate electrode 28 and doped insulating layer 48 is determined by the summation of the thicknesses of floating-gate protect layer 42 and second insulating layer 46. To maintain data retention in the EEPROM device, the relative thicknesses of floating-gate protect layer 42 and second insulating layer 46 must be regulated to avoid excessive separation between floating-gate electrode 28 and doped insulating layer 48. Further, floating-gate protect layer 42 must be of sufficient thickness to insure that refractory metal silicide does not form in floating-gate electrode 28 when refractory metal silicide regions 44 are created in MOS transistor 12 and adjacent areas of semiconductor substrate 10. While floating-gate protect layer 42 must be formed to a sufficient thickness on floating-gate electrode 28, second insulating layer 46 must also be formed to a thickness sufficient to create strain in channel region 26 of the MOS transistor 12. Accordingly, the thicknesses of the floating-gate protect layer 42 and second insulating layer 46 must be specified within acceptable ranges to insure that device performance is enhanced, while data retention is not compromised.

It has surprisingly been discovered that particular thicknesses of second insulating layer 46 produce pronounced improvements in device performance. Table I below shows comparative data for device test structures. To collect the data illustrated in Table I, MOS transistors were fabricated having either a 500 angstrom thick cap oxide layer in accordance with the prior art (structure 1), or a 1000 angstrom thick cap oxide layer in accordance with the invention (structure 2). For each cap oxide thickness, MOS transistors were fabricated having either nominal, short, or long transistor gate lengths. In the structures fabricated for testing, the nominal gate length (designated N) had a gate length of 0.18 microns. Whereas the transistors having a long gate length (designated L) had a gate length of 0.20 microns, and the transistors having a short gate length (designed S) had a gate length of 0.16 microns. Transistor performance data was collected for both structures 1 and 2 in the form of saturation current (designated Idsat) in microamperes per micron, and total propagation delay (designated TPD) in nanoseconds. Further, average values were calculated for both saturation current and propagation delay across all transistor gate lengths for structures 1 and 2.

TABLE 1

Comparative Transistor Performance

| Die ID | Idsat (uA/u) | TPD (ns) |
|---|---|---|
| Prior Art Structure 1 (500A Cap Ox) | | |
| N1 | 649 | 4.32 |
| N2 | 645 | 4.30 |
| S1 | 700 | 3.84 |
| S2 | 712 | 3.68 |
| L1 | 589 | 4.82 |
| L2 | 597 | 4.81 |
| N3 | 643 | 4.31 |
| N4 | 641 | 4.27 |
| S3 | 700 | 3.78 |
| S4 | 698 | 3.83 |
| Avg. | 657 | 4.20 |
| Structure 2 (1000A Cap Ox) | | |
| N1 | 656 | 4.20 |
| N2 | 659 | 4.22 |
| S1 | 726 | 3.74 |
| S2 | 736 | 3.62 |
| L1 | 602 | 4.61 |
| L2 | 608 | 4.62 |
| N3 | 659 | 4.24 |
| N4 | 657 | 4.19 |
| S3 | 734 | 3.67 |
| S4 | 724 | 3.70 |
| Avg. | 676 | 4.08 |

N = nominal gate CD
S = short gate CD
L = long gate CD

The data in Table I shows that transistors fabricated with a 1000 angstrom cap oxide has an average saturation current that is higher than prior art transistors fabricated with a 500 angstrom cap oxide layer. Further, the data shows that the total propagation delay of transistors fabricated with a 1000 angstrom cap oxide layer is less than the propagation delay in transistors having a 500 angstrom cap oxide layer. The total propagation delay values were determined by coupling the transistors to a product timing delay circuit. Accordingly, the delay times listed in Table I are pin-to-pin delay times and are not a measure of individual transistor gate delay. While not wishing to be constrained to any particular theory of the invention, it is believed that the strain in the channel region of an MOS transistor created by increasing the thickness of the cap oxide layer from 500 to 1,000 angstroms improves the electron mobility in the transistor. The improved electron mobility translates into higher saturation current and lower signal propagation delay times.

Figure 5A:
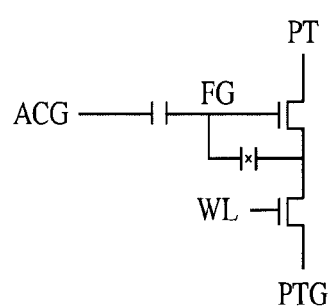
FIGS. 5A and 5B illustrate schematic circuit diagrams of exemplary two-transistor EEPROM memory cells including device structures fabricated in accordance with the invention.
Figure 6A:
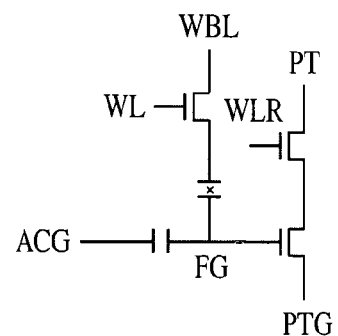
FIGS. 6A and 6B illustrate schematic circuit diagrams of three-transistor EEPROM memory cells including device structures fabricated in accordance with the invention.
Figure 5B:
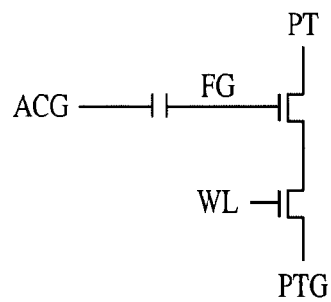
Figure 6B:
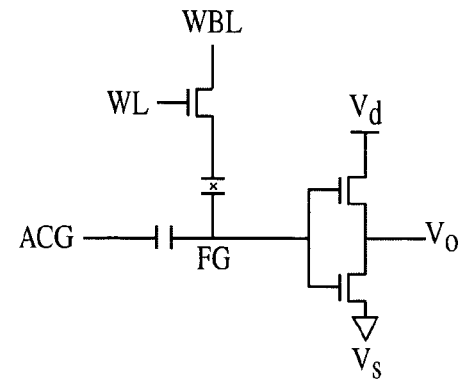

The EEPROM device and fabrication process of the invention can be advantageously employed in a wide variety of EEPROM cell architectures. In accordance with the embodiment of the invention described above, the fabrication process described herein can be employed to fabricate, for example, two-transistor and three-transistor EEPROM devices. Exemplary schematic circuit diagrams of two-transistor EEPROM devices are illustrated in FIGS. 5A and 5B. Schematic circuit diagrams of exemplary three-transistor EEPROM memory cells are illustrated in FIGS. 6A and 6B. Those skilled in the art will recognize that the schematic circuit diagrams illustrate common configurations for two-transistor and three-transistor EEPROM devices. For reference purposes, a control gate region formed in the substrate is depicted by the symbol "ACG" and floating-gate electrode 28 is depicted by the symbol "FG." Further, the symbol "WL" represents a word line, "WBL" represents a write bit line, "WLR" represents a read word line, "PT" represents a product term line, "PTG" represents a product term ground, "$V_d$" and "$V_s$" are supply voltages, and "$V_0$" is an output node voltage. In accordance with the invention, the transistors having a word line gate electrode are fabricated with silicide regions and a cap oxide layer having a thickness of about 800 angstroms to about 1200 angstroms.

Thus, it is apparent that there has been described in accordance with the invention, an EEPROM device having improved performance and a process for fabricating the device that fully provides the advantage set forth above. Although the invention has been described and illustrated with respect to illustrative embodiments thereof, it is not intended that the invention be limited to those illustrative embodiments. Those skilled in the art will recognize that variations and modifications can be made from the embodiments described above. For example, additional MOS transistors typically used in EEPROM devices, such as transistors in peripheral circuitry can also benefit from improved performance through formation of silicide regions and a cap oxide layer fabricated in accordance with the invention. Accordingly, it is intended that all such variations and modifications be included within the scope of the appended claims and equivalents thereof.

What is claimed is:

1. A process for fabricating an EEPROM device comprising:
    providing a substrate;
    forming an MOS transistor having an MOS gate electrode overlying the substrate and source and drain regions in the substrate,
    wherein the MOS gate electrode and the source and drain regions each have a silicide region therein;
    forming a floating-gate electrode overlying the substrate;
    forming a floating gate protection layer at least partially encapsulating the floating-gate electrode;
    forming a cap insulation layer contacting the silicide region in the MOS gate electrode and the source and drain regions,
    wherein the cap insulation layer has a thickness of about 800 angstroms to about 1200 angstroms; and
    forming a doped oxide layer overlying the cap insulation layer,
    wherein the thickness of the floating gate protection layer and the cap insulation layers is such that the floating-gate electrode is spaced apart from the doped oxide layer by at least about 1500 angstroms.

2. The process of claim 1, wherein the thickness of the cap insulation layer is about 1000 angstroms.

3. The process of claim 1, wherein forming a cap insulation layer comprises forming a layer of silicon oxide.

4. The process of claim 1, wherein forming a floating gate protection layer comprises forming a layer of silicon oxide to a thickness of about 500 angstroms.

5. The process of claim 1, wherein forming an MOS transistor and forming a floating gate electrode comprise process steps in the fabrication of a single poly EEPROM device.

6. The process of claim 1, wherein forming silicide regions comprises forming refractory metal silicide regions.

7. The process of claim 6, wherein forming metal silicide regions comprises forming a cobalt silicide region.

8. The process of claim 1, wherein forming a doped oxide layer comprises forming an oxide layer selected from the group consisting of a boron doped silicate glass layer and a boron-phosphorus-doped silicate glass layer.

9. A process for fabricating an EEPROM device comprising:
   providing a substrate;
   forming an MOS transistor having an MOS gate electrode overlying the substrate and source and drain regions in the substrate and a channel region in the substrate below the MOS gate electrode,
   wherein the MOS gate electrode and the source and drain regions each have a silicide region therein, and
   forming a cap insulation layer contacting the silicide region in the MOS gate electrode and the source and drain regions,
   wherein the cap insulation layer has a thickness of about 800 angstroms to about 1200 angstroms,
   wherein forming a cap insulation layer creates strain in the channel region; and
   forming a doped oxide layer overlying the cap insulation layer.

10. A process for forming a high-speed EEPROM device comprising:
    providing a substrate having a floating-gate electrode encapsulated by a first insulating layer and an MOS transistor having a transistor gate electrode overlying a channel region,
    wherein the transistor gate electrode includes a silicide region therein;
    forming a permanent capping layer overlying the first insulating layer and contacting the silicide layer in the transistor gate electrode; and
    forming a doped oxide layer overlying the permanent capping layer,
    wherein the permanent capping layer is formed to a thickness sufficient to create strain in the channel region of the MOS transistor.

11. The process of claim 10, wherein the thickness of the permanent capping layer is about 800 to about 1200 angstroms.

12. The process of claim 11, wherein the thickness of the permanent capping layer is about 1000 angstroms.

13. The process of claim 10, wherein forming a permanent capping layer comprises forming a layer of silicon oxide.

14. The process of claim 10, wherein the thickness of the first insulation layer and the capping layer is such that the doped oxide layer is spaced apart from the floating-gate electrode by at least about 1500 angstroms.

15. The process of claim 14, wherein providing a substrate having a floating-gate electrode encapsulated by a first insulating layer comprises providing a floating gate protection layer having a thickness of about 500 angstroms.

16. The process of claim 10, wherein forming a doped oxide layer comprises forming an oxide layer selected from the group consisting of a boron-doped silicate glass layer and a boron-phosphorus-doped silicate glass layer.

17. An EEPROM device comprising:
    a substrate having a floating-gate electrode overlying the substrate and an MOS transistor, the MOS transistor comprising a gate electrode with a silicide region therein;
    a first insulation layer at least partially encapsulating the floating-gate electrode;
    a second insulation layer overlying the first insulation layer and the gate electrode of the MOS transistor,
    wherein the thickness of the second insulation layer is about 800 angstroms to about 1200 angstroms, and
    wherein the second insulation layer creates strain in the channel region of the MOS transistor; and
    a doped oxide layer overlying the second insulation layer.

18. The EEPROM device of claim 17 further comprising a source and a drain region in the substrate on either side of the gate electrode and separated by a channel region.

19. An EEPROM device comprising:
    a substrate having a floating-gate electrode overlying the substrate and an MOS transistor, the MOS transistor comprising a gate electrode with a silicide region therein;
    a source and a drain region in the substrate on either side of the gate electrode and separated by a channel region;
    a first insulation layer at least partially encapsulating the floating-gate electrode;
    a second insulation layer overlying the first insulation layer and the gate electrode of the MOS transistor,
    wherein the thickness of the second insulation layer is about 800 angstroms to about 1200 angstroms,
    wherein the second insulation layer comprises an insulating material having a thickness sufficient to create strain in the channel region of the MOS transistor; and
    a doped oxide layer overlying the second insulation layer.

20. The EEPROM device of claim 19, wherein the combined thickness of the first insulation layer and the second insulation layer is such that the floating-gate electrode is spaced apart from the doped oxide layer by at least about 1500 angstroms.

* * * * *